(12) United States Patent
Toko et al.

(10) Patent No.: US 9,368,717 B2
(45) Date of Patent: Jun. 14, 2016

(54) MAGNETORESISTIVE ELEMENT AND METHOD FOR MANUFACTURING THE SAME

(71) Applicants: Masaru Toko, Seoul (KR); Masahiko Nakayama, Seoul (KR); Kuniaki Sugiura, Seoul (KR); Yutaka Hashimoto, Seoul (KR); Tadashi Kai, Seoul (KR); Akiyuki Murayama, Seoul (KR); Tatsuya Kishi, Seoul (KR)

(72) Inventors: Masaru Toko, Seoul (KR); Masahiko Nakayama, Seoul (KR); Kuniaki Sugiura, Seoul (KR); Yutaka Hashimoto, Seoul (KR); Tadashi Kai, Seoul (KR); Akiyuki Murayama, Seoul (KR); Tatsuya Kishi, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/200,742

(22) Filed: Mar. 7, 2014

(65) Prior Publication Data
US 2015/0069551 A1   Mar. 12, 2015

Related U.S. Application Data

(60) Provisional application No. 61/876,120, filed on Sep. 10, 2013.

(51) Int. Cl.
*H01L 27/02*   (2006.01)
*H01L 43/12*   (2006.01)
*H01L 43/08*   (2006.01)
*H01L 27/22*   (2006.01)

(52) U.S. Cl.
CPC ............... *H01L 43/12* (2013.01); *H01L 43/08* (2013.01); *H01L 27/228* (2013.01)

(58) Field of Classification Search
CPC .............................. H01L 27/228; H01L 43/08
See application file for complete search history.

(56) References Cited

U.S. PATENT DOCUMENTS

| | | | |
|---|---|---|---|
| 6,165,803 A | 12/2000 | Chen et al. |
| 6,297,983 B1 | 10/2001 | Bhattacharyya |
| 6,365,286 B1 | 4/2002 | Inomata et al. |
| 6,391,430 B1 | 5/2002 | Fullerton et al. |
| 6,479,353 B2 | 11/2002 | Bhattacharyya |
| 6,483,675 B1 | 11/2002 | Araki et al. |
| 6,713,830 B2 | 3/2004 | Nishimura et al. |

(Continued)

FOREIGN PATENT DOCUMENTS

| | | |
|---|---|---|
| JP | 04241481 A | 8/1992 |
| JP | 09041138 A | 2/1997 |

(Continued)

OTHER PUBLICATIONS

English translation of Japanese Kokai 2006-165031 to Matsuura et al., Feb. 2015.*

(Continued)

*Primary Examiner* — Mark Prenty
(74) *Attorney, Agent, or Firm* — Holtz, Holtz & Volek PC

(57) ABSTRACT

According to one embodiment, a magnetoresistive element is disclosed. The magnetoresistive element includes a reference layer. The reference layer includes a first region, and a second region provided outside the first region to surround the same. The second region contains an element contained in the first region and another element being different from the element. The magnetoresistive element further includes a storage layer, and a tunnel barrier layer provided between the reference layer and the storage layer. The storage layer is free from the another element.

11 Claims, 5 Drawing Sheets

(56) References Cited

U.S. PATENT DOCUMENTS

| | | |
|---|---|---|
| 6,829,121 B2 | 12/2004 | Ikeda et al. |
| 6,895,658 B2 | 5/2005 | Shimazawa et al. |
| 6,965,138 B2 | 11/2005 | Nakajima et al. |
| 6,987,652 B2 | 1/2006 | Koganei |
| 7,220,601 B2 | 5/2007 | Hwang et al. |
| 7,586,781 B2 | 9/2009 | Saitoh et al. |
| 7,619,431 B2 | 11/2009 | De Wilde et al. |
| 7,746,603 B2 | 6/2010 | Gill et al. |
| 7,768,824 B2 | 8/2010 | Yoshikawa et al. |
| 7,916,430 B2 | 3/2011 | Kagami et al. |
| 7,957,184 B2 | 6/2011 | Yoshikawa et al. |
| 8,119,018 B2 | 2/2012 | Ikemoto et al. |
| 8,130,474 B2 | 3/2012 | Childress et al. |
| 8,139,405 B2 | 3/2012 | Yoshikawa et al. |
| 8,154,915 B2 | 4/2012 | Yoshikawa et al. |
| 8,218,355 B2 | 7/2012 | Kitagawa et al. |
| 8,223,533 B2 | 7/2012 | Ozeki et al. |
| 8,268,713 B2 | 9/2012 | Yamagishi et al. |
| 8,270,125 B2 | 9/2012 | Gill |
| 8,339,841 B2 | 12/2012 | Iwayama |
| 8,475,672 B2 | 7/2013 | Iori et al. |
| 8,710,605 B2 | 4/2014 | Takahashi et al. |
| 8,716,034 B2 | 5/2014 | Ohsawa et al. |
| 8,884,389 B2 * | 11/2014 | Toko ................... H01L 43/08 257/425 |
| 8,928,055 B2 | 1/2015 | Saida et al. |
| 8,963,264 B2 | 2/2015 | Dimitrov et al. |
| 2001/0022742 A1 | 9/2001 | Bhattacharyya |
| 2001/0024347 A1 | 9/2001 | Shimazawa et al. |
| 2002/0070361 A1 | 6/2002 | Mack et al. |
| 2002/0146851 A1 | 10/2002 | Okazawa et al. |
| 2002/0167059 A1 | 11/2002 | Nishimura et al. |
| 2002/0182442 A1 | 12/2002 | Ikeda et al. |
| 2003/0067800 A1 | 4/2003 | Koganei |
| 2004/0080876 A1 | 4/2004 | Sugita et al. |
| 2004/0188732 A1 | 9/2004 | Fukuzumi |
| 2005/0020076 A1 | 1/2005 | Lee et al. |
| 2005/0048675 A1 | 3/2005 | Ikeda |
| 2005/0174876 A1 | 8/2005 | Katoh |
| 2005/0254289 A1 | 11/2005 | Nakajima et al. |
| 2005/0274997 A1 | 12/2005 | Gaidis et al. |
| 2006/0043317 A1 | 3/2006 | Ono et al. |
| 2006/0105570 A1 | 5/2006 | Hautala et al. |
| 2007/0164338 A1 | 7/2007 | Hwang et al. |
| 2008/0122005 A1 | 5/2008 | Horsky et al. |
| 2009/0080238 A1 | 3/2009 | Yoshikawa et al. |
| 2009/0191696 A1 | 7/2009 | Shao et al. |
| 2009/0243008 A1 | 10/2009 | Kitagawa et al. |
| 2009/0285013 A1 | 11/2009 | Saitoh et al. |
| 2010/0097846 A1 | 4/2010 | Sugiura et al. |
| 2010/0135068 A1 | 6/2010 | Ikarashi et al. |
| 2010/0183902 A1 | 7/2010 | Kim et al. |
| 2010/0230770 A1 | 9/2010 | Yoshikawa et al. |
| 2011/0037108 A1 | 2/2011 | Sugiura et al. |
| 2011/0059557 A1 | 3/2011 | Yamagishi et al. |
| 2011/0159316 A1 | 6/2011 | Wang et al. |
| 2011/0174770 A1 | 7/2011 | Hautala |
| 2011/0211389 A1 | 9/2011 | Yoshikawa et al. |
| 2011/0222335 A1 | 9/2011 | Yoshikawa et al. |
| 2011/0233697 A1 | 9/2011 | Kajiyama |
| 2012/0032288 A1 | 2/2012 | Tomioka |
| 2012/0056253 A1 | 3/2012 | Iwayama et al. |
| 2012/0074511 A1 | 3/2012 | Takahashi et al. |
| 2012/0135543 A1 | 5/2012 | Shin et al. |
| 2012/0139019 A1 | 6/2012 | Iba |
| 2012/0244639 A1 | 9/2012 | Ohsawa et al. |
| 2012/0244640 A1 | 9/2012 | Ohsawa et al. |
| 2013/0017626 A1 | 1/2013 | Tomioka |
| 2013/0069186 A1 | 3/2013 | Toko et al. |
| 2013/0099338 A1 | 4/2013 | Nakayama et al. |
| 2013/0181305 A1 | 7/2013 | Nakayama et al. |
| 2014/0327096 A1 | 11/2014 | Guo |
| 2014/0356979 A1 | 12/2014 | Annunziata et al. |
| 2015/0069542 A1 | 3/2015 | Nagamine et al. |

FOREIGN PATENT DOCUMENTS

| | | |
|---|---|---|
| JP | 2000156531 A | 6/2000 |
| JP | 2001052316 A | 2/2001 |
| JP | 2001308292 A | 11/2001 |
| JP | 2002176211 A | 6/2002 |
| JP | 2002280640 A | 9/2002 |
| JP | 2002299726 A | 10/2002 |
| JP | 2002299727 A | 10/2002 |
| JP | 2002305290 A | 10/2002 |
| JP | 2003110162 A | 4/2003 |
| JP | 2003536199 A | 12/2003 |
| JP | 2004006589 A | 1/2004 |
| JP | 2004500483 A | 1/2004 |
| JP | 2005209951 A | 8/2005 |
| JP | 2006005342 A | 1/2006 |
| JP | 2006510196 A | 3/2006 |
| JP | 2006165031 A | 6/2006 |
| JP | 2007053315 A | 3/2007 |
| JP | 2007234897 A | 9/2007 |
| JP | 2007305610 A | 11/2007 |
| JP | 2008066612 A | 3/2008 |
| JP | 2008522429 A | 6/2008 |
| JP | 2008153527 A | 7/2008 |
| JP | 2008171882 A | 7/2008 |
| JP | 2008193103 A | 8/2008 |
| JP | 2008282940 A | 11/2008 |
| JP | 2009054715 A | 3/2009 |
| JP | 2009081216 A | 4/2009 |
| JP | 2009239120 A | 10/2009 |
| JP | 2010003342 A | 1/2010 |
| JP | 2010113782 A | 5/2010 |
| JP | 2011040580 A | 2/2011 |
| JP | 2011054873 A | 3/2011 |
| JP | 2012244051 A | 12/2012 |
| JP | 2013153232 A | 8/2013 |
| WO | 2005088745 A1 | 9/2005 |

OTHER PUBLICATIONS

U.S. Appl. No. 14/202,802; First Named Inventor: Masahiko Nakayama; Title: "Magnetoresistive Element and Method of Manufacturing the Same"; Filed: Mar. 10, 2014.

U.S. Appl. No. 61/875,577; First Named Inventor: Masahiko Nakayama; Title: "Magnetoresistive Element and Method of Manufacturing the Same"; Filed: Sep. 9, 2013.

U.S. Appl. No. 14/203,249; First Named Inventor: Masahiko Nakayama; Title: "Magnetic Memory and Method of Manufacturing the Same"; Filed: Mar. 10, 2014.

U.S. Appl. No. 61/876,057; First Named Inventor: Masahiko Nakayama; Title: "Magnetic Memory and Method of Manufacturing the Same"; Filed: Sep. 10, 2013.

U.S. Appl. No. 14/200,670; First Named Inventor: Kuniaki Sugiura; Title: "Magnetoresistive Element and Method of Manufacturing the Same "; Filed: Mar. 7, 2014.

U.S. Appl. No. 61/876,081; First Named Inventor: Kuniaki Sugiura; Title: "Magnetoresistive Element and Method Thereof"; Filed: Sep. 10, 2013.

Related U.S. Appl. No. 13/226,868; First Named Inventor: Yuichi Ohsawa; Title: "Method of Manufacturing Magnetic Memory"; Filed: Sep. 7, 2011.

Related U.S. Appl. No. 13/226,960; First Named Inventor: Yuichi Ohsawa; Title: "Method of Manufacturing Multilayer Film"; Filed: Sep. 7, 2011.

Related U.S. Appl. No. 13/231,894; First Named Inventor: Shigeki Takahashi; Title: "Magnetic Memory and Method of Manufacturing the Same"; Filed: Sep. 13, 2011.

Related U.S. Appl. No. 13/604,537; First Named Inventor: Masahiko Nakayama; Title: "Magnetic Memory Element and Magnetic Memory"; Filed: Sep. 5, 2012.

Albert, et al., "Spin-polarized current switching of a Co thin film nanomagnet", Applied Physics Letters, vol. 77, No. 23, Oct. 7, 2000, 3809-3811.

Otani, et al., "Microfabrication of Magnetic Tunnel Junctions Using CH3OH Etching", IEEE Transactions on Magnetics, vol. 43, No. 6, Jun. 6, 2007, 2776-2778.

* cited by examiner

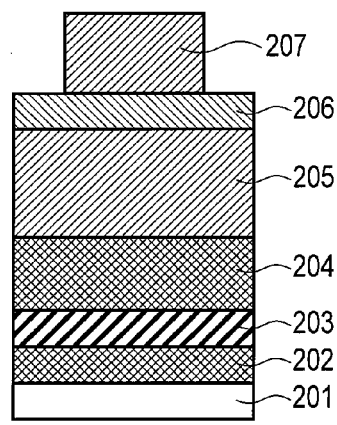
F I G. 3
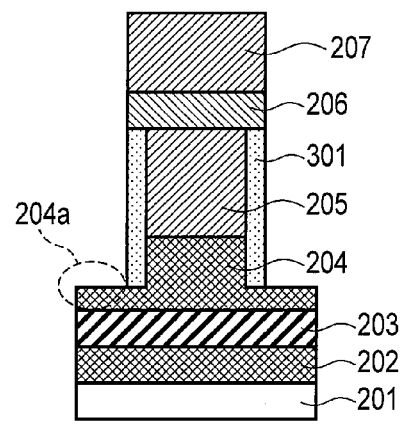
F I G. 4
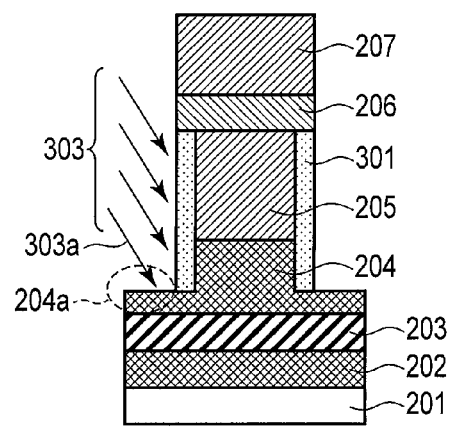
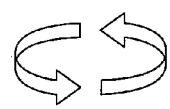
F I G. 5
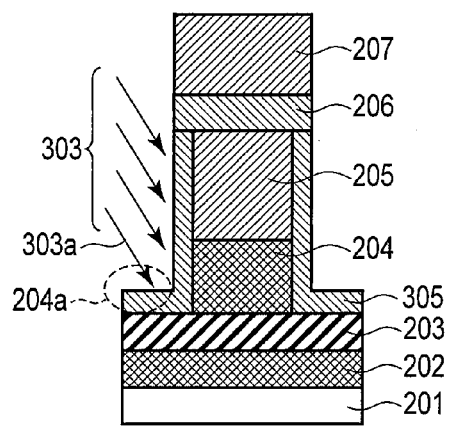
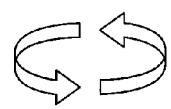
F I G. 6

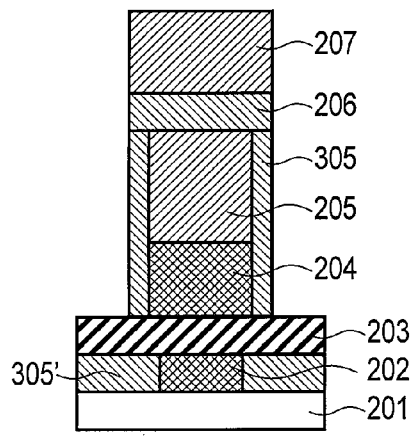 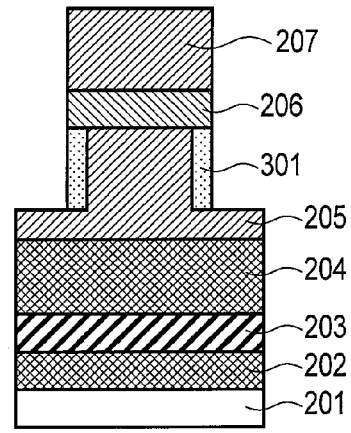
F I G. 11  F I G. 12
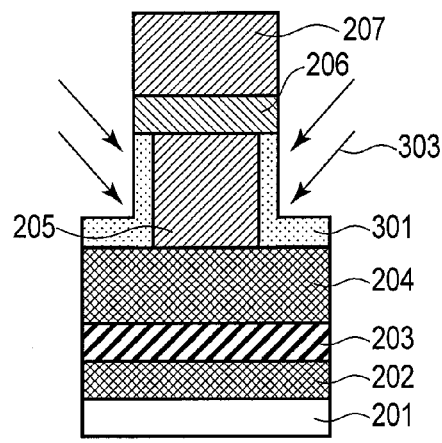 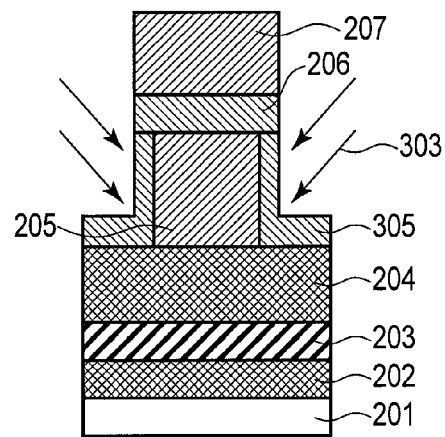
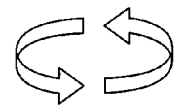 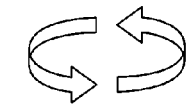
F I G. 13  F I G. 14

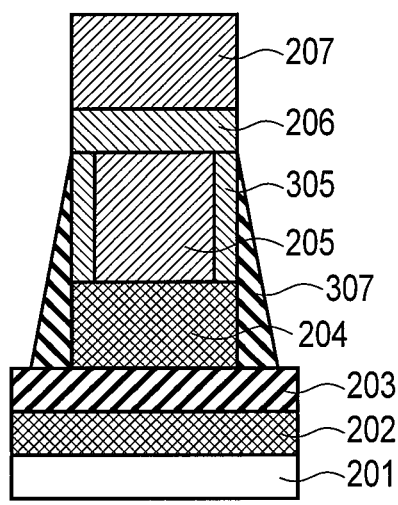
F I G. 15
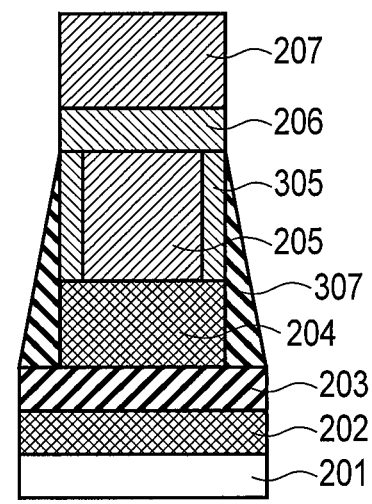
F I G. 16

US 9,368,717 B2

MAGNETORESISTIVE ELEMENT AND METHOD FOR MANUFACTURING THE SAME

CROSS-REFERENCE TO RELATED APPLICATIONS

This application claims the benefit of U.S. Provisional Application No. 61/876,120, filed Sep. 10, 2013, the entire contents of which are incorporated herein by reference.

FIELD

Embodiments described herein relate generally to a magnetoresistive element and method for manufacturing the same.

BACKGROUND

In recent years, a semiconductor memory utilizing a resistance variable element as a memory element, such as a PRAM (phase-change random access memory) or an MRAM (magnetic random access memory), has been attracting attention and being developed. The MRAM is a device which performs a memory operation by storing "1" or "0" information in a memory cell by using a magnetoresistive effect, and has features of nonvolatility, high-speed operation, high integration and high reliability.

One of magnetoresistive effect elements is a magnetic tunnel junction (MTJ) element including a three-layer multilayer structure of a storage layer having a variable magnetization direction, an insulation film as a tunnel barrier, and a reference layer which maintains a predetermined magnetization direction.

The resistance of the MTJ element varies depending on the magnetization directions of the storage layer and the reference layer, it takes a minimum value when the magnetization directions are parallel, and takes a maximum value when the magnetization directions are antiparallel, and information is stored by associating the parallel state and antiparallel state with binary information "0" and binary information "1", respectively.

Write of information into the MTJ element involves a magnetic-field write scheme in which only the magnetization direction in the storage layer is reversed by a current magnetic field that is generated when a current flowing is flowed through a write line, and a write (spin injection write) scheme using spin angular momentum movement in which the magnetization direction in the storage layer is reversed by passing a spin polarization current through the MTJ element itself.

In the former scheme, when the element size is reduced, the coercivity of a magnetic body constituting the storage layer increases and the write current tends to increase, and thus it is difficult to achieve both the miniaturization and low electric current.

On the other hand, in the latter scheme (spin injection write scheme), spin polarized electron to be injected into the MTJ element decreases with the decrease of the volume of the magnetic layer constituting the storage layer, so that it is expected that both the miniaturization and low electric current may be easily achieved.

BRIEF DESCRIPTION OF THE DRAWINGS

FIG. 3 is a cross-sectional view for explaining a method for manufacturing an MTJ element of the magnetic memory according to the first embodiment;

FIG. 4 is a cross-sectional view for explaining the method for manufacturing the MTJ element of the magnetic memory according to the first embodiment following FIG. 3;

FIG. 5 is a cross-sectional view for explaining the method for manufacturing the MTJ element of the magnetic memory according to the first embodiment following FIG. 4;

FIG. 6 is a cross-sectional view for explaining the method for manufacturing the MTJ element of the magnetic memory according to the first embodiment following FIG. 5;

FIG. 11 is a cross-sectional view illustrating a problem of the ion implantation when no reference layer exists;

FIG. 12 is a cross-sectional view for explaining a method for explaining a MTJ element of a magnetic memory according to a second embodiment;

FIG. 13 is a cross-sectional view for explaining the method for manufacturing the MTJ element of the magnetic memory according to the second embodiment following FIG. 12;

FIG. 14 is a cross-sectional view for explaining the method for manufacturing the MTJ element of the magnetic memory according to the second embodiment following FIG. 13;

FIG. 15 is a cross-sectional view for explaining the method for manufacturing the MTJ element of the magnetic memory according to the second embodiment following FIG. 14; and FIG. 16 is a cross-sectional view for explaining the method for manufacturing the MTJ element of the magnetic memory according to the second embodiment following FIG. 15.

DETAILED DESCRIPTION

Figure 1:
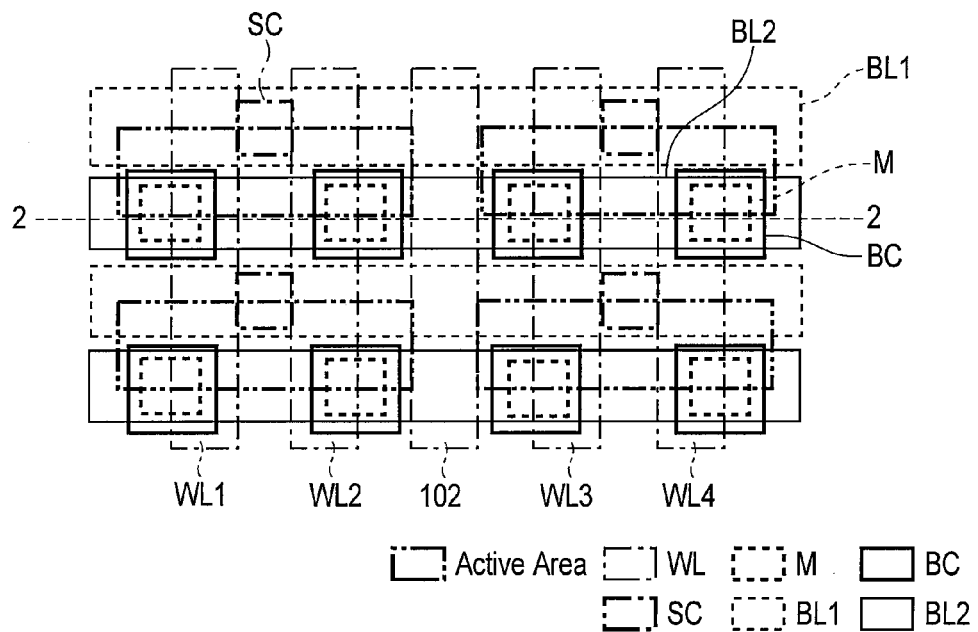
FIG. 1 is a plane view showing a magnetic memory according to a first embodiment.

Hereinafter the embodiments will be described with reference to the accompanying drawings. In the following drawings, the parts corresponding to those in a preceding drawing are denoted by like reference numerals (including numerals with different suffixes), and an overlapping description is omitted.

In general, according to one embodiment, a magnetoresistive element is disclosed. The magnetoresistive element includes a reference layer. The reference layer includes a first region, and a second region provided outside the first region to surround the first region. The second region contains an element contained in the first region and another element being different from the element. The magnetoresistive element further includes a storage layer, and a tunnel barrier layer provide between the reference layer and the storage layer. The storage layer is free of the another element.

According to another embodiment, a magnetoresistive element is disclosed. The magnetoresistive element includes a shift cancelling layer. The shift cancelling layer includes a first region, and a second region provided outside the first region to surround the first region. The second region contains an element contained in the first region and another element different from the element. A reference layer is provided on the shift cancelling layer. The reference layer is free of the another element. A tunnel barrier layer is provided on the reference layer. A storage layer is provided on the tunnel barrier layer. The storage layer is free of the another element.

According to still another embodiment, a method for manufacturing a magnetoresistive element is disclosed. The method includes forming a stacked body including a tunnel barrier layer and a reference layer. The tunnel barrier is formed on a storage layer, the reference layer is formed on the tunnel barrier layer. A hard mask is formed on the stacked body. The stacked body is etched. The etching is stopped before the tunnel barrier layer is exposed. An element is implanted in a side face of the stacked body exposed by the etching.

First Embodiment

Figure 2:
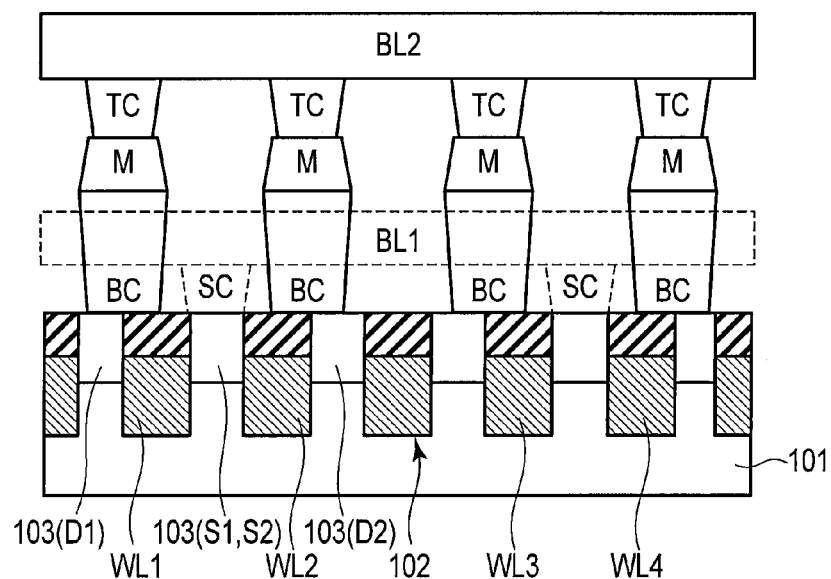
FIG. 2 is a cross-sectional view taken along line 2-2 in FIG. 1.
Figure 7:
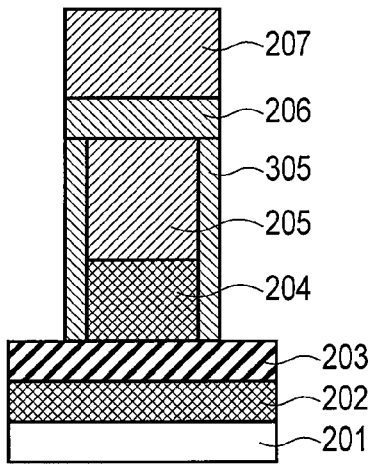
FIG. 7 is a cross-sectional view for explaining the method for manufacturing the MTJ element of the magnetic memory according to the first embodiment following FIG. 6.
Figure 8:
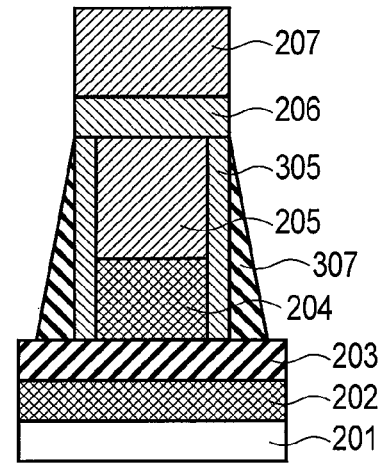
FIG. 8 is a cross-sectional view for explaining the method for manufacturing the MTJ element of the magnetic memory according to the first embodiment following FIG. 7.
Figure 9:
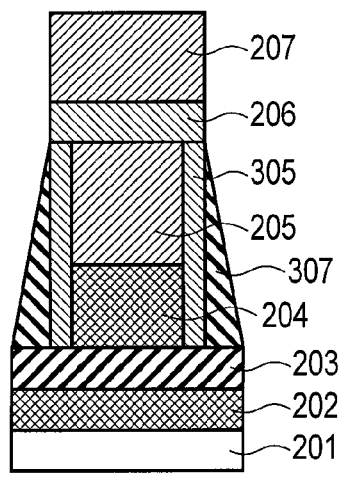
FIG. 9 is a cross-sectional view for explaining the method for manufacturing the MTJ element of the magnetic memory according to the first embodiment following FIG. 8.

FIG. 1 is a plane view schematically showing a magnetic memory according to a first embodiment. FIG. 2 is a cross-sectional view taken along line 2-2 in FIG. 1. In the present embodiment, the magnetic memory is an MRAM and a magnetoresistive element is an MTJ element.

In the figures, reference numeral 101 denotes a silicon substrate (semiconductor substrate), an element isolation region 102 is formed in a surface of the silicon substrate. The element isolation region 102 is a gate (a gate insulating film and an underlying gate electrode thereunder (a dummy word line)) embedded in the surface of the silicon substrate 101, a so-called "(BG) buried gate". The element isolation region 102 defines active areas. In the figure, four active areas are shown.

The MRAM of the present embodiment comprises a first selection transistor of which gate electrode is a word line WL1, a first MTJ element M connected to one of source/drain regions 103 (drain region D1) of this first selection transistor, a second selection transistor of which gate electrode is a word line WL2, and a second MTJ element M connected to one of source/drain regions 103 (drain region D2) of this second selection transistor.

That is, one memory cell of the present embodiment comprises one MTJ (memory element) and one selection transistor, the two select transistors of the two neighboring memory cells share the other source/drain region 103 (source region S1, S2).

The gate (gate insulating film, gate electrode) of the select transistor in the present embodiment is the BG as with the element isolation region 102.

One source/drain region 103 (D1) of the first select transistor is connected to a lower part of the first MTJ element M via a plug BC. An upper part of the first MTJ element M is connected to a second bit line BL2 via a plug TC.

The other source/drain region 103 (S1) of the first selection transistor is connected to a first bit line (source line) BL1 via a plug SC.

One of the source/drain region 103 (D2) of the second selection transistor is connected to a lower part of the second MTJ element M via a plug BC. An upper part of the second MTJ element M is connected to the second bit line BL2 via a plug TC.

The other source/drain region 103 (S2) of the second selection transistor is connected to the first bit line BL1 via the plug SC.

The first selection transistor, the first MTJ element M, the second selection transistor, and the second MTJ element (two memory cells) are provided in each active area. Two neighboring active areas are isolated by the isolation region (BG) 102.

The bit lines BL1 and BL2 are configured to have alternately changed heights (at every two lines). Thereby, a pitch between neighboring BL lines is relaxed to be doubled, and a parasitic capacitance between neighboring bit lines is reduced. In the figure, the bit line BL2 is higher than the bit line BL1, but, conversely, the bit line BL2 may be higher than the bit line BL1.

The word lines WL3 and WL4 correspond to the word line WL1 and WL2, respectively. Accordingly, two memory cells are constituted by a first select transistor of which gate electrode is the word line WL3, a first MTJ element M which is connected to one source/drain region 104 of the first select transistor, a second transistor of which gate electrode is a second word line WL2, and a second MTJ element M which is connected to one source/drain region 104 of the second select transistor.

FIG. 3 to FIG. 9 are cross-sectional views for explaining a method for manufacturing the MTJ element of the MRAM of the present embodiment.

[FIG. 3]

An underlying layer 201, a storage layer 202, a tunnel barrier layer 203, a reference layer 204, a shift cancelling layer 205, and a conductive cap layer 206 are sequentially formed, hereafter, a conductive hard mask 207 is formed on the conductive cap layer 206.

The underlying layer 201 includes a lower electrode (not shown).

The storage layer 202 includes, for example, CoFeB.

The tunnel barrier layer 103 includes, for example, magnesium oxide (MgO).

The reference layer 204 includes, for example, an alloy of Pt (precious metal) and Co (magnetic substance).

The shift cancelling layer 205 has a function to lessen and adjust a shift of reversal current in the storage layer 202 caused by a leakage magnetic field from the reference layer 204.

The cap layer 206 includes, for example, Pt, W, and Ta.

The hard mask 207 includes, for example, Ta or Ru. The processes for forming the hard mask 207 include, a step of forming a conductive film of Ta or Ru, a step of forming a resist pattern on the conductive film, and a step of processing the conductive film into a mask shape by etching the conductive film by RIE (reactive ion etching) using the resist pattern as a mask. Here, the hard mask 207 serves concurrently as an upper electrode, the hard mask and the upper electrode may be different layers, respectively.

[FIG. 4]

The cap layer 206 is etched by IBE (ion beam etching) process using the hard mask 207 as a mask, thereafter, the shift cancelling layer 205 and the reference layer 204 are etched by RIE process using the hard mask 207 as a mask.

At this time, the etching of the reference layer 204 is stopped before a surface of the tunnel barrier layer 203 is exposed. A lower part 204a of the reference layer 204, which is positioned outside the hard mask 207, is not disappeared by the etching but remains.

Furthermore, the above mentioned RIE causes a damage layer 301 on the exposed side faces of the shift cancelling layer 205 and the reference layer 204 in which the exposed side faces is due to the etching. The damage layer 301 causes a reduction in switching field of the shift cancelling layer 205 and the reference layer 204. When the switching field reduces, magnetic reversal of the shift cancelling layer 205 and the reference layer 204 easily occurs due to external magnetization. This leads to reduce the function of the shift cancelling layer 205 and the reference layer 204.

[FIG. 5 and FIG. 6]

In the present embodiment, ions 303 are implanted into the damage layer 301 by oblique ion implantation method to reduce the influence of the damage layer generated on the side faces of the shift cancelling layer 205 and the reference layer 204. The oblique ion implantation is performed with turning the substrate on which the MTJ element is to be formed. The reduction of the influence of the damage layer 301 is achieved since the damage layer 301 is demagnetized by the implantation of ions 303.

In FIG. 6, reference numeral 305 denotes a region into which the ions 303 are implanted (an ion implanted region). The ion implanted region 305 in the magnetic layer (the reference layer 204, the shift cancelling layer 205) is a demagnetized region. The ion implanted region 305 has a width of a few nm.

The reference layer 204 comprises a region (first region) which does not contain an element corresponding to the ion 303 and the ion implanted region 305 (second region) provided outside the first region to surround the first region, which contains the element (magnetic substance) contained in the first region and the element corresponding to the ion 303.

The shift cancelling layer 205 comprises a region (third region) which does not contain the element corresponding to the ion 303 and the ion implanted region 305 (fourth region) provided outside the third region to surround the third region, which contains the element (magnetic substance) contained in the third region and the element corresponding to the ion 303.

In the above mentioned oblique ion implantation, the ions 303a coming from the outside of the hard mask 207 to enter the storage layer 202 via the tunnel barrier layer 203 collides against the reference layer 204a on the outside of the hard mask 207. Consequently, the ions 303a lose its kinetic energy in the reference layer 204a and do not reach the storage layer 202.

Figure 10:
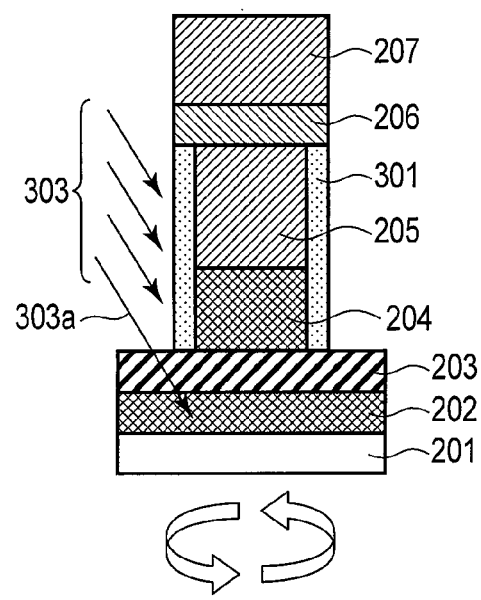
FIG. 10 is a cross-sectional view illustrating an aspect of ion implantation when no reference layer exists.

Absence of the reference layer 204a, as shown in FIG. 10, the ions 303a are implanted into the storage layer 202 below the hard mask 207. As a result, as shown in FIG. 11, an ion implanted region 305' (demagnetized region) is generated in the storage layer 202, and the magnetic layer functioning as the storage layer 202 decreases.

The element (the other element) used for the ion 303 may be at least one of, for example, As, Ge, Ga, Sb, In, N, Ar, He, F, Cl, Br, I, O, Si, B, C, Zr, Tb, S, Se, P, and Ti.

[FIG. 7]

The reference layer 204a is removed by IBE process using the hard mask 207 as a mask.

[FIG. 8]

By known method, an insulating sidewall 307 is formed on the side walls of the reference layer 204 and the shift cancelling layer 205. Material of the sidewall 307 is, for example, silicon nitride.

[FIG. 9]

The tunnel barrier layer 203, storage layer 202, and underlying layer 201 are etched by IBE process using the hard mask 207 and the side wall 307 as masks. The side faces of the reference layer 204 and the shift cancelling layer 205 are covered with the insulating sidewall 307. The conductive etching residue generated in the IBE process adheres on the surface of the insulating sidewall 307. Therefore, there is not any short circuit occurring between the storage layer 202 and the reference layer 204, and between the storage layer 202 and the shift cancelling layer 205 due to the conductive etching residue.

Second Embodiment

FIG. 12 to FIG. 16 are cross-sectional views illustrating a manufacturing method of the MTJ element of the MRAM of a second embodiment.

In the first embodiment, the ion implantation is performed when the RIE process (etching) is stopped midway through the reference layer 204, but in the present embodiment, the ion implantation is performed when the RIE process (etching) is stopped midway through the shift cancelling layer 205.

[FIG. 12]

The step of FIG. 3 in the first embodiment is performed. Nzt, the cap layer 206 is etched by IBE process using the hard mask 207 as a mask, subsequently, the shift cancelling layer 205 is etched by RIE process using the hard mask 207 as a mask.

At this time, the etching process of the shift cancelling layer 205 is stopped before the surface of the reference layer 204 is exposed. A lower part of the shift cancelling layer 205, which is positioned outside the hard mask 207, is not disappeared by the etching but remains.

Furthermore, the above mentioned RIE causes the damage layer 301 on the exposed side faces of the shift cancelling layer 205 in which the exposed side faces is due to the etching.

[FIG. 13 and FIG. 14]

To reduce the influence of the damage layer 301 on the side face of the shift cancelling layer 205, the ions 303 are implanted into the damage layer 301 by oblique ion implantation method. In the present embodiment, the ion implanted region 305 is generated in the shift cancelling layer 205 whereas the ion implanted region 305 (demagnetized region) is not generated in the reference layer 204 and storage layer 202.

The shift cancelling layer 205 comprises a region (first region) which does not contain the element corresponding to the ion 303, and the ion implanted region 305 (second region) provided outside the first region to surround the first region, which contains the element (magnetic substance) contained in the first region and the element corresponding to the ion 303.

[FIG. 15]

The shift cancelling layer 205, the reference layer 204 are etched using the hard mask 207 as a mask, thereafter, the insulating sidewall 307 is formed.

[FIG. 16]

The tunnel barrier layer 203, storage layer 202, and underlying layer 201 are etched by IBE process using the hard mask 207 and the side wall 307 as masks.

Though various structural types of MTJ elements exist, the manufacturing method of the present embodiments is generally applicable to a manufacturing method of the MTJ elements which includes implanting element into a magnetic layer for reducing damage of the magnetic layer caused by RIE process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element, comprising:
a reference layer comprising a first region, and a second region provided outside the first region to surround the first region, the second region containing an element contained in the first region and another element different from the element, wherein the another element is at least one element selected from the group consisting of As, Ge, Ga, Sb, In, N, Ar, He, O, Si, B, C, Zr, Tb, S, Se, P, and Ti;
a storage layer which is free of the another element; and
a tunnel barrier layer provided between the reference layer and the storage layer,
wherein a width of the tunnel barrier layer and a width of the storage layer are larger than a width of the reference layer.

2. The element according to claim 1, further comprising:
a shift cancelling layer provided on the reference layer, wherein the shift cancelling layer comprises a third region which is free of the another element, and a fourth region provided outside the third region to surround the third region, wherein the fourth region contains an element contained in the third region and the another element.

3. The element according to claim 2, further comprising:
a cap layer provided on the shift cancelling layer.

4. A magnetoresistive element, comprising:
a reference layer comprising a first region, and a second region provided outside the first region to surround the first region, the second region containing an element contained in the first region and another element different from the element, wherein the another element is at least one element selected from the group consisting of As, Ge, Ga, Sb, In, N, Ar, He, O, Si, B, C, Zr, Tb, S, Se, P, and Ti;
a storage layer which is free of the another element; and
a tunnel barrier layer provided between the reference layer and the storage layer,
wherein a width of the tunnel barrier layer is approximately equal to a width of the storage layer.

5. The element according to claim 2, wherein a width of the shift cancelling layer is approximately equal to the width of the reference layer.

6. The element according to claim 2, further comprising:
an insulating sidewall covering side walls of the reference layer and the shift cancelling layer.

7. The element according to claim 1, wherein the second region is demagnetized.

8. The element according to claim 2, wherein the fourth region is demagnetized.

9. A magnetoresistive element, comprising:
a shift cancelling layer comprising a first region, and a second region provided outside the first region to surround the first region, the second region containing an element contained in the first region and another element different from the element;
a reference layer provided on the shift cancelling layer, wherein the reference layer is free of the another element;
a tunnel barrier layer provided on the reference layer; and
a storage layer provided on the tunnel barrier layer, wherein the storage layer is free of the another element.

10. The element according to claim 9, wherein the another element is at least one element selected from the group consisting of As, Ge, Ga, Sb, In, N, Ar, He, F, Cl, Br, I, O, Si, B, C, Zr, Tb, S, Se, P, and Ti.

11. The element according to claim 10, wherein the second region is demagnetized.

* * * * *